(12) United States Patent
Suzuki et al.

(10) Patent No.: US 9,238,725 B2
(45) Date of Patent: Jan. 19, 2016

(54) INFRARED REFLECTIVE FILM, INFRARED REFLECTIVE PAINT AND INFRARED REFLECTIVE BODY

(71) Applicant: Nihon Tokushu Toryo Co., Ltd., Kita-ku, Tokyo (JP)

(72) Inventors: Hiroshi Suzuki, Tokyo (JP); Yasufumi Saga, Tokyo (JP); Masaki Hanaeda, Tokyo (JP)

(73) Assignee: Nihon Tokushu Toryo Co., Ltd., Kita-ku, Tokyo (JP)

( * ) Notice: Subject to any disclaimer, the term of this patent is extended or adjusted under 35 U.S.C. 154(b) by 0 days.

(21) Appl. No.: 14/355,961

(22) PCT Filed: Oct. 31, 2012

(86) PCT No.: PCT/JP2012/078164
§ 371 (c)(1),
(2) Date: May 2, 2014

(87) PCT Pub. No.: WO2013/065733
PCT Pub. Date: May 10, 2013

(65) Prior Publication Data
US 2014/0283912 A1 Sep. 25, 2014

(30) Foreign Application Priority Data

Nov. 4, 2011 (JP) ................... 2011-242179

(51) Int. Cl.
| | |
|---|---|
| *C08K 3/34* | (2006.01) |
| *C09D 133/00* | (2006.01) |
| *C09D 201/10* | (2006.01) |
| *C09D 5/00* | (2006.01) |
| *G02B 5/26* | (2006.01) |
| *C09D 5/33* | (2006.01) |
| *C09D 7/12* | (2006.01) |
| *H01L 31/052* | (2014.01) |
| *H01L 31/056* | (2014.01) |
| *C08K 9/02* | (2006.01) |

(52) U.S. Cl.
CPC . *C08K 3/34* (2013.01); *C09D 5/004* (2013.01); *C09D 7/1225* (2013.01); *C09D 133/00* (2013.01); *C09D 201/10* (2013.01); *G02B 5/26* (2013.01); *H01L 31/052* (2013.01); *H01L 31/056* (2014.12); *C08K 9/02* (2013.01)

(58) Field of Classification Search
CPC .......... C09D 5/00; C09D 7/12; C09D 133/00; C09D 201/10; G02B 5/26; C08K 3/34; C08K 9/02; H01L 31/05

USPC ............ 524/449; 523/135; 136/259; 359/350
See application file for complete search history.

(56) References Cited

U.S. PATENT DOCUMENTS

| | | | |
|---|---|---|---|
| 7,553,540 B2 | 6/2009 | Debergalis et al. | |
| 7,728,056 B2* | 6/2010 | Kuvshinnikova et al. | ...... 524/94 |
| 2003/0030041 A1* | 2/2003 | Genjima et al. | ............. 252/587 |
| 2007/0129470 A1 | 6/2007 | Kuvshinnikova et al. | |
| 2007/0129482 A1* | 6/2007 | Kuvshinnikova et al. | .... 524/500 |
| 2007/0154704 A1 | 7/2007 | Debergalis et al. | |
| 2009/0260677 A1 | 10/2009 | Debergalis et al. | |
| 2009/0293944 A1 | 12/2009 | Debergalis et al. | |
| 2012/0024352 A1 | 2/2012 | Debergalis et al. | |
| 2012/0240986 A1 | 9/2012 | Debergalis et al. | |

FOREIGN PATENT DOCUMENTS

| | | | |
|---|---|---|---|
| JP | H11-302549 A | | 11/1999 |
| JP | 2002-060698 A | | 2/2002 |
| JP | 2002-309157 A | | 10/2002 |
| JP | 2002309157 A | * | 10/2002 |
| JP | 2005-090042 A | | 4/2005 |
| JP | 2008-083378 A | | 4/2008 |
| JP | 2008-093378 A | | 4/2008 |
| JP | 2009-518515 A | | 5/2009 |
| JP | 2009-522414 A | | 6/2009 |
| JP | 2010-212381 A | | 9/2010 |
| JP | 2011-093310 A | | 5/2011 |
| JP | 2011093310 A | * | 5/2011 |

OTHER PUBLICATIONS

Oct. 7, 2014—(JP) Notification of Reasons for Refusal—App 2013-54181—Eng Tran.
Search Report issued in corresponding International Application No. PCT/JP2012/078164 mailed Jan. 29, 2013.
Written Opinion issued in corresponding International Application No. PCT/JP2012/078164 mailed Jan. 29, 2013.
Jun. 5, 2015—(EP) Supplementary Search Report—App 12845646.
Aug. 19, 2015—(CN) Office Action—App 201280054155.2—Eng Tran (machine).

* cited by examiner

*Primary Examiner* — Michael M Bernshteyn
(74) *Attorney, Agent, or Firm* — Banner & Witcoff, Ltd.

(57) ABSTRACT

Provided is infrared ray reflective paint which is used to form a film having a high reflectance in an infrared ray wavelength region, a high transmittance in a visible ray wavelength region, and a self-cleaning ability, and the infrared ray reflective paint contains: an acrylic resin that contains at least one of a silyl group and a silanol group, and a metal oxide-coated mica wherein one or more metal oxides selected from a tin oxide, a titanium oxide, and a silicon oxide is coated on a surface of mica, and the infrared ray reflective paint contains the metal oxide-coated mica in an amount of 0.4% to 1.5% in terms of PVC (Pigment Volume Concentration).

5 Claims, 2 Drawing Sheets

US 9,238,725 B2

INFRARED REFLECTIVE FILM, INFRARED REFLECTIVE PAINT AND INFRARED REFLECTIVE BODY

CROSS REFERENCE TO RELATED APPLICATIONS

This is a U.S. National Phase Application under 35 U.S.C. §371 of International Application No. PCT/JP 2012/078164, filed Oct. 31, 2012,which was published Under PCT Article 21(2), the entire contents of which are incorporated herein by reference.

TECHNICAL FIELD

The present invention relates to an infrared ray reflective film, an infrared ray reflective paint, and an infrared ray reflective body.

BACKGROUND ART

Most of light, which is reaching the surface of the earth from the sun, is absorbed by the atmosphere, and a part of the light arrives at the surface of the earth. In the light, a wavelength region of approximately 700 nm to 1 mm of which the wavelengths are longer than wavelengths of a red wavelength region in a visible ray region is called infrared ray. In the infrared ray, especially, a wavelength region of 4000 nm to 1 mm is called far-infrared ray. Far-infrared rays are also called heat rays which are generated in a heating equipment to be used in daily life.

Meanwhile, if a temperature rise caused by absorbing far-infrared rays can be suppressed, it may be possible to use it in various industry fields. For example, among solar cell modules used in a solar power generation panel, it is known that, when a temperature of a solar cell module using crystalline silicon increases, the output voltage decreases. This is because, when a forbidden band width decreases at a high temperature, the output voltage decreases. Accordingly, when the infrared ray can be selectively reflected on a surface of the solar cell module, it is possible to suppress a temperature rise within the module so that a decrease in output voltage may be avoided.

If a pigment that reflects infrared ray is mixed with a paint composition, it is possible to give an effect of reflecting at least the infrared ray to a coaing film. As the conventionally known pigments that reflect the infrared ray, for example, there are metal oxide-based pigments such as a titanium oxide, a chrome oxide, a cobalt oxide and a barium oxide. However, in the case an infrared ray reflective paint is compounded using such pigments, brightness of a color tone is greatly limited. For this reason, Japanese Patent Application Laid-Open No. 11-302549 (Patent Document 1) discloses a composition having an excellent function of reflecting the infrared ray regardless of the brightness of the color tone.

PRIOR ART DOCUMENT

Patent Document

Patent Document 1: Japanese Patent Application Laid-Open No. 11-302549

SUMMARY OF THE INVENTION

Problems that the Invention is to Solve

However, a conventional composition having the infrared ray reflecting function, including the composition disclosed in Patent Document 1, is a so-called enamel paint which reflects the infrared ray but does not transmit visible ray. Therefore, it is impossible to coat the enamel paint on a solar cell module. In order to coat the paint on a surface of the solar cell, it is necessary to form a coating film by using a composition that preferably transmits visible ray required to generate a power as much as possible, and selectively reflects the infrared ray. Furthermore, what is required is a coating film which is excellent in self-cleaning ability capable of removing dust when the surface is brought into contact with water even if the dust collects on the surface, while having the aforementioned performance.

Accordingly, an object of the present invention is to provide an infrared ray reflective film that has a high visible ray transmittance, reflects infrared ray, and has a high self-cleaning ability, and an infrared ray reflective paint for forming the infrared ray reflective film.

Means for Solving the Problems

Accordingly, as a result of earnest study, the present inventors have invented an infrared ray reflective film as a clear coating film of a predetermined thickness in which an average infrared ray reflectance in an infrared ray region is 7.5% or more, a transmittance in a visible ray region is 60% or more, and a water contact angle on a coating film surface is 60° or less. Further, the present inventors have invented an infrared ray reflective paint that contains a specific resin and a specific mica, and an infrared ray reflective body coated with the paint.

In addition, the gist of the present invention will be described below.

[1] An infrared ray reflective paint that is a clear paint, the infrared ray reflective paint containing:
an acrylic resin that contains at least one of a silyl group and a silanol group, and
a metal oxide-coated mica wherein one or more metal oxides selected from a tin oxide, a titanium oxide and a silicon oxide is coated on a surface of mica, wherein the metal oxide-coated mica is contained in an amount of 0.4% to 1.5% in terms of PVC (Pigment Volume Concentration).

[2] An infrared ray reflective film obtained from the infrared ray reflective paint described in [1].

[3] The infrared ray reflective film as described in [2] wherein the infrared ray reflective film is a clear coating film with a dry film thickness of 15 μm to 60 μm, and an average infrared ray reflectance in a range of 780 nm to 2500 nm is 7.5% or more, an average visible ray transmittance in a range of 380 nm to 780 nm is 60% or more, and a water contact angle on a surface of the coating film is 60° or less.

[4] An infrared ray reflective body containing:
a solar cell module and the infrared ray reflective film as described in [2] or [3] on a surface of the solar cell module.

[5] An infrared ray reflective body containing:
a glass and the infrared ray reflective film as described in [2] or [3] on a surface of the glass.

[6] An infrared ray reflective body containing a siding board and the infrared ray reflective film as described in [2] or [3] on a surface of the siding board.

[7] An infrared ray reflective body containing an exposed concrete and the infrared ray reflective film as described in [2] or [3] on a surface of the exposed concrete.

[8] An infrared ray reflective film that is a clear coating film with a dry film thickness of 15 μm to 60 μm, wherein an average infrared ray reflectance in a range of 780 nm to 2500 nm is 7.5% or more, an average visible ray transmittance in a range of 380 nm to 780 nm is 60% or more, and a water contact angle on a surface of the coating film is 60° or less.

Advantage of the Invention

According to the present invention, it is possible to provide an infrared ray reflective film which has a high visible ray transmittance, reflects infrared rays and has a high self-cleaning ability, and an infrared ray reflective paint for forming the infrared ray reflective film. Furthermore, it is possible to coat the infrared ray reflective paint on various materials to be coated (for example, a solar cell module, a glass, a siding board, and an exposed concrete) without a primer, and it is possible to provide an infrared ray reflective body applicable to various uses by providing the infrared ray reflective film on a surface of the material to be coated.

MODE FOR CARRYING OUT THE INVENTION

Figure 1:
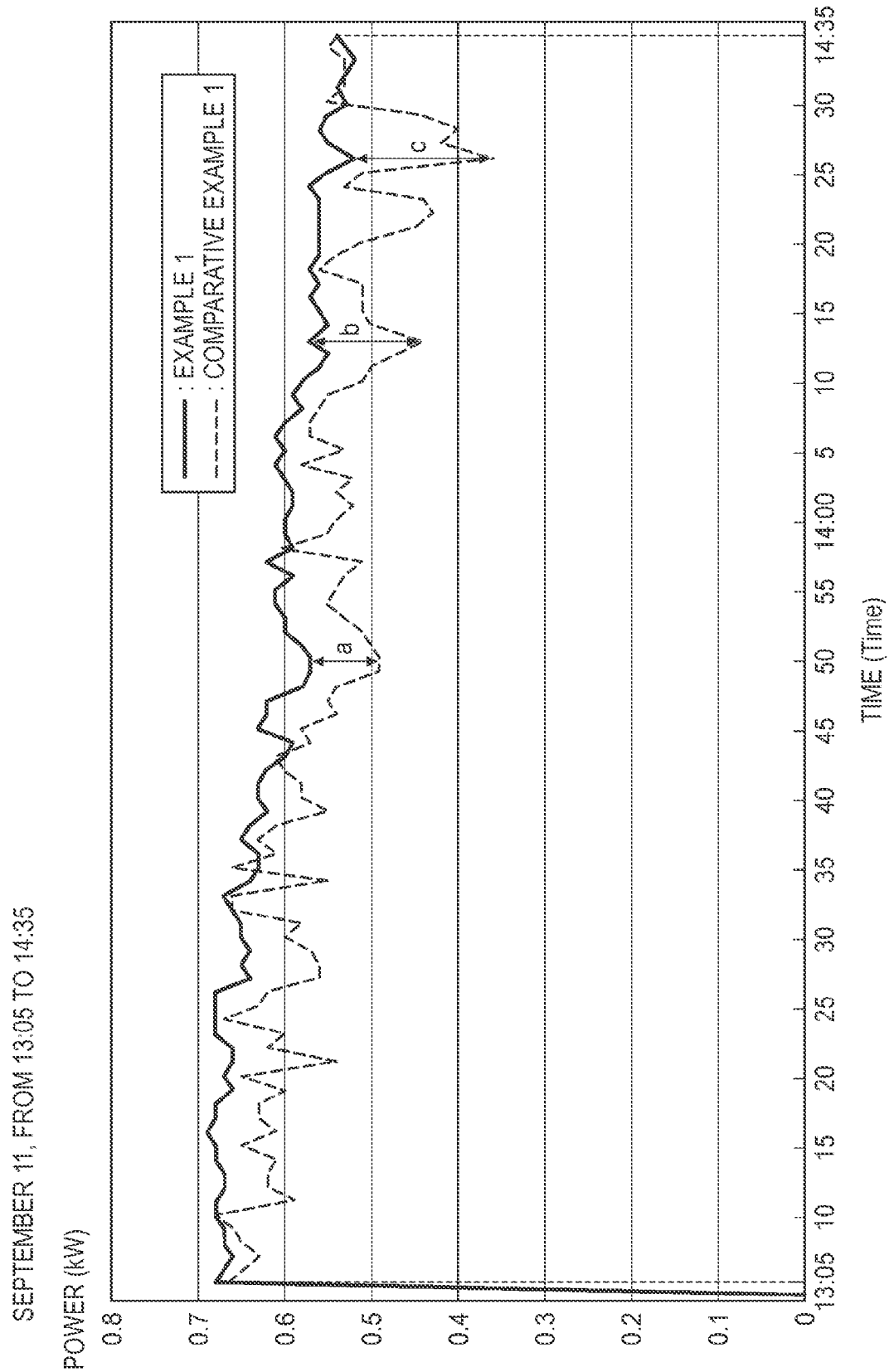
FIG. 1 is a graph representing a relationship between the measuring times and powers generated by solar cell modules A and B through Testing Method 1.

Hereinafter, the present invention will be described in detail.
[Infrared Reflective Film]

An infrared ray reflective film of the present invention is a clear coating film with a dry film thickness of 15 μm to 60 μm in which an average infrared ray reflectance in a range of 780 nm to 2500 nm is 7.5% or more, an average visible ray transmittance in a range of 380 nm to 780 nm is 60% or more, and a water contact angle on a surface of the coating film is 60° or less.

The infrared ray reflective film of the present invention has a film thickness of 15 μm to 60 μm in a dry film thickness.

The infrared ray reflective film of the present invention requires that an average infrared ray reflectance in a range of 780 nm to 2500 nm in a so-called infrared ray region is 7.5% or more. More preferably, it is suitable that the average infrared ray reflectance is 10% or more. When the average infrared ray reflectance is less than 7.5%, an effect of preventing a temperate rise could possibly be low.

The average infrared ray reflectance is measured as follows.
(Method of Measuring Average Infrared Reflectance)

The average infrared ray reflectance is measured using an integrating sphere method. Specifically, samples for measurement (samples including an infrared ray reflective film having a film thickness of 30 μm on a glass plate) are prepared, and reflectance in an infrared ray wavelength region of 780 nm to 2500 nm is measured at every 5 nm (an incident angle of 8°) by using a UV-VIS-NIR spectrometer (Solid Spec-3700 commercially available from Shimadzu Corporation). An average value in the range of 780 nm to 2500 nm is measured, and the average value is referred to as an average infrared ray reflectance in the wavelength range of 780 nm to 2500 nm. Further, the float glass plate (with size of 200 mm×100 mm×2 mm), which is a product according to JIS R 3202 and is commercially available from TP Giken Co., Ltd., was used as the glass plate. The average infrared ray reflectance of the glass plate is 6.1%.

The infrared ray reflective film of the present invention is a "clear coating film." In the present invention, the "clear coating film" is required to include a transparent or translucent film. Specifically, it is required that an average visible ray transmittance in a range of 380 nm to 780 nm within a so-called visible ray region is 60% or more. More preferably, the average visible ray transmittance is 70% or more, and especially preferably, the average visible ray transmittance is 80% or more. If the average visible ray transmittance is less than 60%, the power-generation performance by a solar cell module may be degraded when the coating film is formed on a surface of the solar cell module.

Furthermore, since the infrared ray reflective film of the present invention is a clear coating film, it is possible to give a heat-insulating property or an antifouling property to a substrate such as a siding board or an exposed concrete while maintaining the texture of the substrate (underlayer) when the infrared ray reflective film is coated on the underlayer.

The average visible ray transmittance is measured as follows.
(Method of Measuring Average Visible Ray Transmittance)

An average visible ray transmittance is measured using the integrating sphere method. Specifically, samples for measurement (samples including an infrared ray reflective film having a film thickness of 30 μm on a glass plate) are prepared, and transmittance in a visible ray wavelength region of 380 nm to 780 nm is measured at every 5 nm (an incident angle of 0°) by using the UV-VIS-NIR spectrometer (Solid Spec-3700 commercially available from Shimadzu Corporation). An average value in a range of 380 nm to 780 nm is obtained, and the average value is referred to as an average visible ray transmittance in the range of 380 nm to 780 nm. Further, the float glass plate (a size of 200 mm×100 mm×2 mm), which is a product according to JIS R 3202 and is commercially available from TP Giken Co., Ltd., was used as the glass plate. An average visible ray transmittance of the glass plate is 90.2%.

In the infrared ray reflective film of the present invention, a water contact angle of a coating film surface is required to be equal to or less than 60°. More preferably, the water contact angle of the coating film surface is equal to or less than 40°. If the water contact angle of the coating film surface exceeds 60°, the coating film surface is not easily get with water if the coating film surface comes in contact with the water due to rain or the like. Therefore, there is a possibility that the self-cleaning ability may be degraded.

Moreover, the infrared ray reflective film obtained from infrared ray reflective paint of the present invention to be described below may have the water contact angle exceeding 60° when hydrolysis of the silyl group and the silanol group of acrylic resin that contains at least one of a silyl group and a silanol group, which is the component of the infrared ray reflective paint, does not proceed directly after coating. However, when the hydrolysis proceeds with time and the water contact angle becomes equal to or less than 60°, the infrared ray reflective film is considered to be included in the infrared ray reflective film of the present invention. That is, the infrared ray reflective film of the present invention has a water contact angle on a coating film surface which is equal to or less than 60° when it is measured after a predetermined period of time (for example, two months) elapses directly after coating.

The water droplet contact angle is measured as follows.

(Method of Measuring Water Droplet Contact Angle)

A sample for measurement (a sample including an infrared ray reflective film having a film thickness of 30 μm on a glass plate) is prepared, and a contact angle is measured through a droplet method by bringing water droplets into contact with a coating film surface of the sample for measurement using a contact angle gauge (FACE CA-DT type commercially available from Kyowa Interface Science Co., LTD.).

The infrared ray reflective film of the present invention is obtained from the infrared ray reflective paint of the present invention to be described below.

[Infrared Reflective Paint]

The infrared ray reflective paint (hereinafter, also referred to as "paint" or "clear paint") of the preset invention is a clear paint. The infrared ray reflective paint contains an acrylic resin that contains at least one of a silyl group and a silanol group and metal oxide-coated mica wherein one or more metal oxides selected from a tin oxide, a titanium oxide and a silicon oxide is coated on a surface of mica, and the infrared ray reflective paint contains the metal oxide-coated mica an amount of 0.4% to 1.5% in terms of PVC (Pigment Volume Concentration).

The metal oxide-coated mica in the infrared ray reflective paint of the present invention has an infrared ray reflecting function.

The paint of the present invention is a paint which is usually referred to as a clear paint, and preferably, the paint is not mixed with a pigment such as a colored pigment. A component to be mixed for selectively reflecting the infrared ray wavelength region is mica having the infrared ray reflecting function. Since the metal oxide-coated mica wherein one or more metal oxides selected from a tin oxide, a titanium oxide and a silicon oxide is coated on a surface of mica causes an interference effect of incident light due to a difference in refractive index of light between the metal oxide coated on the surface and the mica inside the metal oxide, the metal oxide-coated mica has a beautiful color called pearl-gray. For this reason, a pigment using interference of light, such as the metal oxide-coated mica, is called a pearl pigment, and is applied to a cosmetic field or a printing field.

The present inventors pay attention to very distinguishable optical properties of the metal oxide-coated mica.

It is possible to form a coating film capable of transmitting visible rays and reflecting infrared rays by compounding the metal oxide-coated mica in the paint by a predetermined amount.

When forming a clear coating film, the metal oxide-coated mica needs to be contained in an amount of 0.4% to 1.5% in the paint in terms of PVC (Pigment Volume Concentration). The content of the metal oxide-coated mica in the paint is preferably 0.5% to 1.0% in terms of PVC and more preferably, 0.7% to 1.0% in terms of PVC.

When the content of the metal oxide-coated mica in the clear paint is less than 0.4% in terms of PVC, the reflection in the infrared ray region is not sufficiently achieved. There, although the visible rays are sufficiently transmitted, there is a possibility that a temperature rise may not be prevented.

When the content exceeds 1.5% in terms of PVC, the visible ray transmittance decreases. Thus, when the clear coating film is formed by coating the clear paint of the present invention on the surface of the solar cell module, there is a possibility that the power-generation performance may be degraded.

The "PVC" is an abbreviation for Pigment Volume Concentration, and, in the present invention, is a ratio of a volume (volume %) of the metal oxide-coated mica to a volume of the total solid content of the infrared ray reflective paint.

An average particle diameter of the metal oxide-coated mica is preferably 5 μm to 60 μm.

A coverage of the metal oxide-coated mica by the metal oxide (preferably, a titanium oxide) is preferably 40% to 50%.

Here, the coverage refers to a mass ratio of the metal oxide to the mica.

The paint of the present invention is a clear paint. A resin which may be used as a resin contained in the paint of the present invention is an acrylic resin that contains at least one of a silyl group and a silanol group since the acrylic resin exhibits affinity with respect to a material to be coated.

A number-average molecular weight of the acrylic resin that contains at least one of a silyl group and a silanol group is preferably 100,000 to 1,000,000.

The acrylic resin that contains at least one of a silyl group and a silanol group contains preferably 10 to 60 mass % of a silyl group and a silanol group and more preferably, 20 to 40 mass % of a silyl group and a silanol group with respect to the total solid content of the acrylic resin.

In the case that a material coated with the paint of the present invention is an inorganic substance such as a glass or a concrete, the acrylic resin contains at least one of a silyl group and a silanol group and thereby, affinity between the surface of the inorganic substance and the coating film formed thereon is improved. For this reason, a primer is not required when coating. In addition, since the silyl group and the silanol group are changed to hydroxyl groups by the hydrolysis, a water contact angle of the coating film surface decreases to 60° or less and a self-cleaning ability by rain is exhibited. Further, as described above, since the hydrolysis of the silyl group and the silanol group does not proceed directly after painting, the water contact angle may increase to 60° or more in some cases. However, when the hydrolysis proceeds with time (for example, after two months) and the water contact angle becomes to 60° or less, the self-cleaning ability by rain is exhibited.

When paint does not come in close contact with the material to be coated unless the primer is coated, it is likely to cause degradation with time such as yellowing depending on a kind of resin used in the primer. Furthermore, it leads to the increase of the number of coating processes.

A hardening accelerator, a catalyst, an antifoaming agent, a film forming assistant, a photostabilizer, a surface conditioner, water, and a solvent may be appropriately compounded in the clear paint of the present invention.

It is desirable for the clear paint of the present invention to form a coating film having a film thickness of 15 μm to 60 μm, preferably, 25 μm to 35 μm in a dry film thickness. When the coating film has a thickness of less than 15 μm, there is a possibility that the reflection of infrared ray may become insufficient. Meanwhile, when the thickness of the coating film exceeds 60 μm, there is a possibility that the visible ray transmittance decreases and thus, the power-generation performance of the solar cell module may be degraded.

Depending on the film thickness of the infrared ray reflective film, it is desirable to appropriately adjust the content of the metal oxide-coated mica in the clear paint of the present invention. Specifically, it is desirable that, in a case of a thick film, the content of the metal oxide-coated mica in the clear paint of the present invention is preferably adjusted to be small, and in a case of a thin film, the content of the metal oxide-coated mica in the clear paint of the present invention is adjusted to be large.

Since the surface of the formed coating film is very excellent in weather resistance, it is possible to maintain the performance of the coating film for a long time.

Moreover, due to high hydrophilicity, the surface of the formed coating film has a self-cleaning performance since, even though dust collects on the surface, rainwater uniformly spreads on the surface and easily flushes the dust. Accordingly, such properties of the coating film are very effective in maintaining the power-generation performance of the solar cell module.

In addition to the solar cell module, the paint of the present invention can be coated on a siding board, an exposed concrete, and a glass without a primer.

The clear paint of the present invention coated on a window glass is effective in preventing an interior temperature rise by the infrared ray reflecting performance thereof while maintaining transparency of the window glass. When the clear paint is coated on the window glass, the clear paint may be coated on the window glass indoors and outdoors.

Although clear paints to be coated on a window glass are on the market, the clear paints contain an infrared ray absorption pigment and have a problem of causing occurrence of heat cracks of the window glass. Since the clear paint of the present invention has the infrared ray reflecting function, heat crack of the window glass is not caused.

In addition, in a case in which the clear paint of the present invention is coated on a window glass, when an ultraviolet ray absorbent is added, it is possible to add a function of preventing furniture from being faded by sunlight or a function of preventing insects from approaching, in addition to the function of relieving the interior temperature rise.

When the clear paint of the present invention is coated on the siding board or the exposed concrete, it is possible to protect a building and to prevent a temperature rise while maintaining, the external appearance and texture of the underlayer. Further, due to the high weather resistance the high self-cleaning performance, and the low contaminant performance, an exterior decoration of the building may be beautifully maintained for a long time.

The paint of the present invention can be produced by a conventionally known mixing and dispersing method. A mixer such as a dissolver or an attritor may be used.

The paint of the present invention may be coated using a coater such as an air spray, an airless spray, a roller coating, a roll coater or a curtain flow coater. Since it is necessary that a coating film is finished with as uniform a thickness as possible, a spray coating method such as the air spray or the airless spray is desirable. When coating is performed at line within a factory, a coating method such as the roll coater or the curtain flow coater may be applied.

Although the paint of the present invention may be dried at room temperature to form a coating film, the paint may be heated and dried for 20 minutes to 40 minutes at a temperature of 60° C. to 90° C. after coating the paint of the present invention on the material to be coated.

Hereinafter, in order to understand the present invention, specific examples will be described. Of course, the present invention is not limited to the examples below.

EXAMPLE

Example 1

Infrared ray reflective paint 1 was obtained by diluting a paint containing 73 mass % of a resin acrylic emulsion containing a silyl group and a silanol group, 6 mass % of a film forming agent (dipropylene glycol monobutyl ether), 0.3 mass % of a photostabilizer (hindered amine-based), 0.1 mass % of an anti-forming agent (organic modified polysiloxane-based), and 0.7% in terms of PVC (Pigment Volume Concentration) of titanium oxide-coated mica, with water to be 100 mass %.

Example 2

Infrared ray reflective paint 2 was obtained by diluting paint containing 73 mass % of a resin acrylic emulsion including a silyl group and a silanol group, 6 mass % of a film forming agent (dipropylene glycol monobutyl ether), 0.3 mass % of a photostabilizer (hindered amine-based), 0.1 mass % of an anti-forming agent (organic modified polysiloxane-based) and 1.0% in terms of PVC (Pigment Volume Concentration) of titanium oxide-coated mica with water to be 100 mass %.

[Testing Method 1]

A clear coating film having an average dry film thickness of 30 μm was obtained by coating the infrared ray reflective paint 1 of the present invention on a surface of a crystalline silicon solar cell module (glass) by the air spray coater and then drying the coated infrared ray reflective paint at room temperature for 12 hours. This solar cell module is referred to as solar cell module A (Example 1).

As a comparison test, a solar cell module having the same power generation efficiency and area as those of the crystalline silicon solar cell module used as the solar cell module A and whose surface were not coated with the infrared ray reflective paint of the present invention was prepared. This solar cell module is referred to as solar cell module B (Comparative Example 1).

On an exposure table which has no obstacle on the south side, eight solar cell modules A and eight solar cell modules B were disposed to be inclined at 30°, and powers generated by the solar cell modules and surface temperatures of the solar cell modules were measured for 1 hour and 30 minutes from 13:05 to 14:35 on a sunny day.

[Testing Method 2]

A clear coating film having an average dry film thickness of 30 μm was obtained by coating the infrared ray reflective paint 2 of the present invention on the siding board through the air spray coating and then drying the coated infrared ray reflective paint at room temperature for 12 hours. This siding board is referred to as siding board A (Example 2).

As a comparison test, a siding board having the same area as that of the siding board used as the siding board A and whose surface was not coated was prepared. This siding board is referred to as a siding board B (Comparative Example 2).

Siding boards A and B were horizontally provided at 20 cm under a reflector lamp, the reflector lamp of 100 W illuminated the surfaces of the siding boards at a room temperature of 25° C., and the temperatures of the rear-side centers of the siding boards were measured.

Further, the external appearances of the siding boards A and B were observed visually to evaluate the textures of the underlayers.

[Result 1]

The results of power generated by the solar cell modules through Testing Method 1 are represented in FIG. 1. The vertical axis of the graph represents the power (unit: kW) generated by solar cell modules A and B, and the horizontal axis represents the measuring time.

Referring to FIG. 1, it is apparent that the power output of modules A (Example 1) formed with the clear coating film using the clear paint of the present invention are higher than that of modules B (Comparative Example 1) free of the coating film over the almost entire measuring period of time in which, per one solar cell module, an output of 10 W (in the difference indicated by "a" in FIG. 1, (570 W−490 W)/8=10 W) is increased at the time, 13:50, an output of 16.5 W (in the difference indicated by "b" in FIG. 1, (570 W−440 W)/8=16.5 W) per is increased at the time, 14:12, and an output of 21.3 W (in difference indicated by "c" in FIG. 1, (520 W−350 W)/8=21.3 W) is increased at the time, 14:26.

[Result 2]

Figure 2:
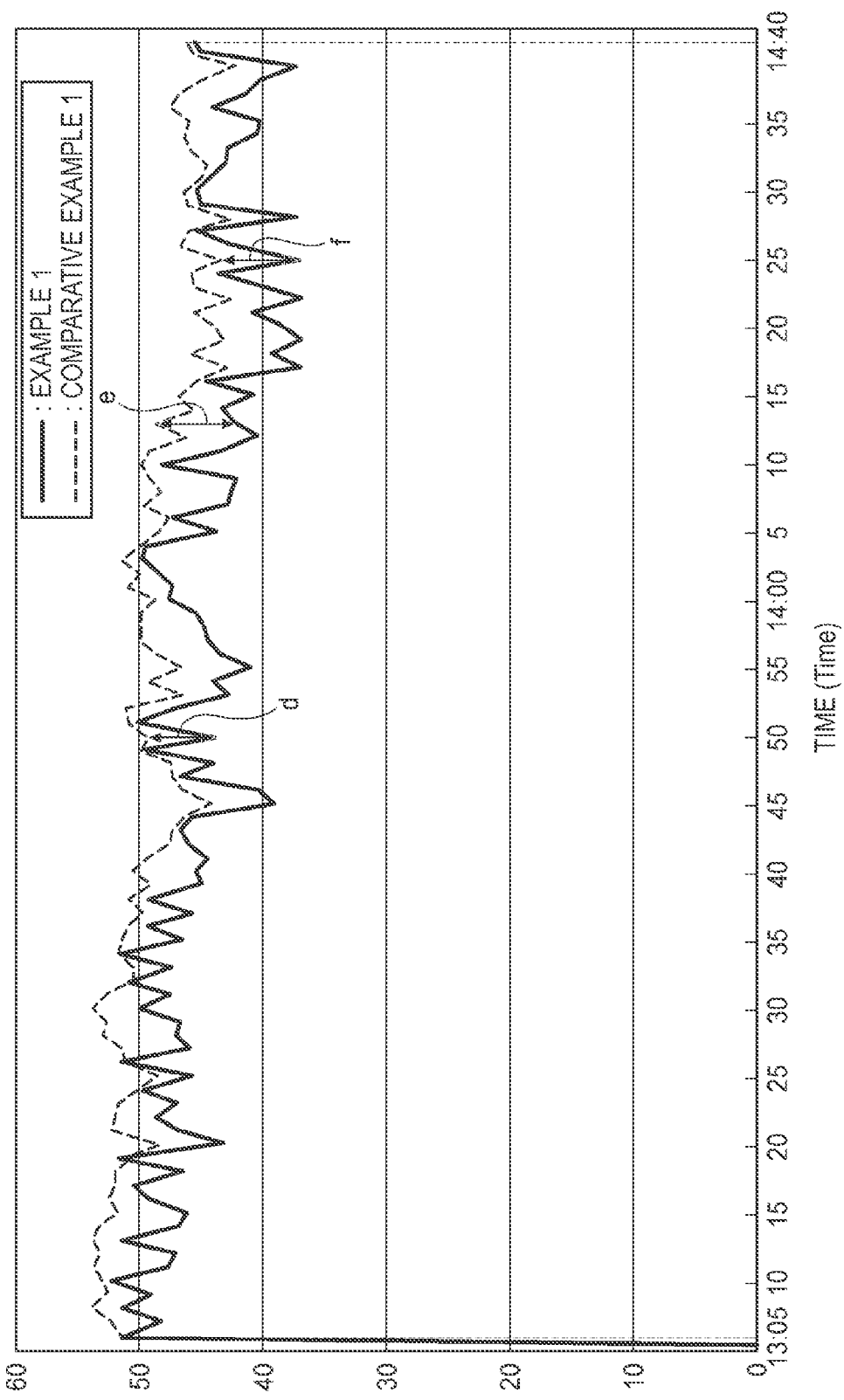
FIG. 2 is a graph representing a relationship between the measuring times and surface temperatures of solar cell modules A and B through Testing Method 1.

The results of surface temperature of the solar cell modules through Testing Method 1 are represented in FIG. 2. The vertical axis of the graph represents the surface temperature of solar cell modules A and B (unit: ° C.), and the horizontal axis represents the measuring time.

Referring to FIG. 2, the surface temperature of modules A (Example 1) formed with the clear coating film using the clear paint of the present invention is lower than that of modules B (Comparative Example 1) free of the coating film over the almost entire range of measuring temperature. At the time, 13:50, a temperature decrease of 6.4° C. (in the difference indicated by "d" in FIG. 2, 49.4° C.−43.0° C.=6.4° C.) was confirmed, at the time, 14:12, a temperature decrease of 6.1° C. (in the difference indicated by "e" in FIG. 2, 48.6° C.−42.5° C.=6.1° C.) was confirmed, and at the time of 14:26, a temperature decrease of 5.4° C. (in the difference indicated by "f" in FIG. 2, 42.7° C.−37.3° C.=5.4° C.) was confirmed.

[Result 3]

Through Testing Method 2, the rear-side temperature of siding board A (Example 2) formed with a clear coating film using the clear paint of the present invention exhibited a decrease of 5.3° C. as compared to siding board B (Comparative Example 2) free of the clear coating film.

Further, siding board A (Example 2) formed with the clear coating film using the clear paint of the present invention did not substantially exhibit a change in external appearance and maintained the texture of the underlayer at a good status as compared to siding board B (Comparative Example 2) free of the clear coating film.

The results of Examples 1 and 2 and Comparative Examples 1 and 2 are represented in Table 1 below. Average infrared ray reflectance, average visible ray transmittance and water droplet contact angle of the coating films in Examples 1 and 2 were evaluated through a method to be described below.

(Method of Measuring Average Infrared Reflectance)

A sample for measurement was prepared by coating the respective paint on a glass plate to form coating film having a dry film thickness of 30 μm. The reflectance in the infrared ray wavelength region of 780 nm to 2500 nm was measured at every 5 nm (an incident angle of 8°) by using a UV-VIS-NIR spectrometer (Solid Spec-3700 commercially available from Shimadzu Corporation). An average value in the wavelength range of 780 nm to 2500 nm was obtained. The average value is referred to as an average infrared ray reflectance in the range of 780 nm to 2500 nm. Further, the float glass plate (a size of 200 mm×100 mm×2 mm), which is a product according to JIS R 3202 and is commercially available from TP Giken Co., Ltd., was used as the glass plate. The average infrared ray reflectance of the glass plate was 6.1%.

(Method of Measuring Average Visible Ray Transmittance)

A sample for measurement was prepared by coating the respective paint on a glass plate to form coating film having a dry film thickness of 30 μm. The transmittance in the visible ray wavelength region of 380 nm to 780 nm was measured at every 5 nm (an incident angle of 0°) by using the UV-VIS-NIR spectrometer (Solid Spec-3700 commercially available from Shimadzu Corporation). An average value of the transmittance in the range of 380 nm to 780 nm was obtained. The average value is referred to as an average visible ray transmittance in the range of 380 nm to 780 nm. Further, the float glass plate (a size of 200 mm×100 mm×2 mm), which is a product according to JIS R 3202 and is commercially available from TP Giken Co., Ltd., was used as the glass plate. The average visible ray transmittance of the glass plate was 90.2%.

TABLE 1

| | | Example 1 | Comp. Example 1 | Example 2 | Comp. Example 2 |
|---|---|---|---|---|---|
| Paint | Content of acrylic resin including silyl group/silanol group | 73 mass % | — | 73 mass % | — |
| | Kind of coated metal oxide | Titanium oxide | — | Titanium oxide | — |
| | Metal oxide-coated mica, PVC | 0.7% | — | 1.0% | — |
| Coating | Substrate | Crystalline silicon solar cell | Crystalline silicon solar cell | Siding board | Siding board |
| | Coating method | Air spray | Uncoated | Air spray | Uncoated |
| Coating film | External appearance | Translucent | — | Translucent | — |
| | Film thickness | 30 μm | — | 30 μm | — |
| | Average infrared ray reflectance | 9.9% | — | 10.3% | — |
| | Average visible ray transmittance | 70.4% | — | 68.9% | — |
| | Water contact angle | 56° | — | 56° | — |
| Performance | Substrate temperature | Decrease | Reference | Decrease | Reference |
| | Power generation amount | Increase | Reference | — | — |
| | Texture of underlayer | — | — | Good | Reference |

Examples 3 and 4, and Comparative Examples 3 and 4

Each of paints of Examples 3 and 4 and Comparative Examples 3 and 4 was produced in the same manner as the infrared ray reflective paint 1 of Example 1 except that the PVC of the titanium oxide-coated mica was changed as represented in Table 2 below.

[Evaluation of Performance of Coating Film]

With regard to coating films obtained from the paints of Examples 1 to 4 and Comparative Examples 3 and 4, average infrared ray reflectance, average visible ray transmittance and water droplet contact angle were measured as follows.

(Method of Measuring Water Droplet Contact Angle)

A sample for measurement was prepared by coating the respective paint on a glass plate to form coating film having a dry film thickness of 30 μm and preserving the formed coating film for two months at a temperature of 23° C. and a relative humidity of 65%. A contact angle was obtained through a droplet method by bringing water droplet into contact with coating film surface of the sample for measurement by using a contact angle gauge (a FACE CA-DT type commercially available from Kyowa Interface Science Co., LTD.).

The results are represented in Table 2 below.

TABLE 2

|  |  | Example 1 | Example 2 | Example 3 | Example 4 | Comp. Example 3 | Comp. Example 4 |
|---|---|---|---|---|---|---|---|
| Paint | Metal oxide-coated mica, PVC | 0.7% | 1.0% | 0.4% | 1.5% | 0.3% | 1.6% |
| Coating film | Average infrared ray reflectance | 9.9% | 10.3% | 7.6% | 12.3% | 7.2% | 13.0% |
|  | Average visible ray transmittance | 70.4% | 68.9% | 80.1% | 63.1% | 82.4% | 58.2% |
|  | Water contact angle | 56° | 56° | 56° | 56° | 56° | 56° |

INDUSTRIAL APPLICABILITY

It became apparent that, when the infrared ray reflective paint of the present invention was coated on a surface of a solar cell module, power output was improved as compared to a case where no coating was formed. Moreover, since the coating film formed by the infrared ray reflective paint of the present invention has very high hydrophilicity and flushes dust, powder dust or the like on the coated surface from the surface by rain, it is possible to give a self-cleaning ability, so that it is possible to prevent a decrease in transmittance of visible rays due to contamination of the surface.

Although the present invention has been described in detail with reference to specific examples, it will be apparent to those skilled in the art that various changes or medications may be made without departing from the scope and spirit of the present invention.

This application claims the priority of Japanese Patent Application (Japanese Application No. 2011-242179) filed on November 4, 2011, the disclosure of which is incorporated herein by reference.

The invention claimed is:

1. An infrared ray reflective film comprising an infrared ray reflective paint containing:
    an acrylic resin that contains a silyl group, a silanol group, or both; and
    a metal oxide-coated mica wherein one or more metal oxides selected from a tin oxide, a titanium oxide and a silicon oxide is coated on a surface of mica,
    wherein the metal oxide-coated mica is contained in an amount of 0.4% to 1.5% in terms of PVC (Pigment Volume Concentration);
    wherein the infrared ray reflective film has a dry film thickness of 15 µm to 60 µm, and an average infrared ray reflectance in a range of 780 nm to 2500 nm is 7.5% or more, an average visible ray transmittance in a range of 380 nm to 780 nm is 60% or more, and a water contact angle on a surface of the coating film is 60° or less.

2. An infrared ray reflective body containing:
    a solar cell module and
    the infrared ray reflective film as claimed in claim 1 on a surface of the solar cell module.

3. An infrared ray reflective body containing:
    a glass and
    the infrared ray reflective film as claimed in claim 1 on a surface of the glass.

4. An infrared ray reflective body containing:
    a siding board and
    the infrared ray reflective film as claimed in claim 1 on a surface of the siding board.

5. An infrared ray reflective body containing:
    an exposed concrete and
    the infrared ray reflective film as claimed in claim 1 on a surface of the exposed concrete.

* * * * *